United States Patent
Seo

(10) Patent No.: US 7,580,509 B2
(45) Date of Patent: Aug. 25, 2009

(54) TELEPHONE HOOK SWITCH USING NON-CONTACT CAPACITIVE SENSOR AND TELEPHONE USING THE SAME

(75) Inventor: Ho-Kyong Seo, Suwon-si (KR)

(73) Assignee: Samsung Electronics Co., Ltd., Suwon-si, Gyeonggi Do (KR)

( * ) Notice: Subject to any disclaimer, the term of this patent is extended or adjusted under 35 U.S.C. 154(b) by 721 days.

(21) Appl. No.: 11/269,580

(22) Filed: Nov. 9, 2005

(65) Prior Publication Data

US 2006/0104435 A1   May 18, 2006

(30) Foreign Application Priority Data

Nov. 12, 2004   (KR) ...................... 10-2004-0092688

(51) Int. Cl.
  *H04M 9/00* (2006.01)
(52) U.S. Cl. ..................................... 379/55.1
(58) Field of Classification Search ................ 379/55.1, 379/382
  See application file for complete search history.

(56) References Cited

U.S. PATENT DOCUMENTS

| | | | | |
|---|---|---|---|---|
| 3,109,893 | A | * | 11/1963 | Burns .......................... 379/252 |
| 4,528,425 | A | | 7/1985 | Melindo et al. |
| 4,613,730 | A | | 9/1986 | Fechalos et al. |
| 5,485,509 | A | | 1/1996 | Oliver |
| 6,160,885 | A | | 12/2000 | Scott et al. |
| 6,301,344 | B1 | | 10/2001 | Meyer et al. |
| 6,687,371 | B1 | | 2/2004 | Fischer et al. |
| 6,865,269 | B1 | | 3/2005 | Li et al. |
| 7,010,098 | B2 | * | 3/2006 | Moquin et al. ............. 379/56.1 |

FOREIGN PATENT DOCUMENTS

| | | |
|---|---|---|
| JP | 62-003546 | 1/1987 |
| JP | 02-188049 | 7/1990 |
| KR | 2002-0089298 | 11/2002 |
| WO | WO 1985/000948 | 2/1985 |
| WO | WO 03/094352 | 11/2003 |

OTHER PUBLICATIONS

Korean Office action corresponding to Korean Patent Application No. 2004-0092688, issued on Mar. 30, 2006.
British Office Action of the British Patent Application No. GB0523001.6, issued on Feb. 27, 2006.
*Office action* from the Australian Patent Office issued in Applicant's corresponding Australian Patent Application No. 2005232266 dated Feb. 6, 2008.

* cited by examiner

*Primary Examiner*—Creighton Smith
(74) *Attorney, Agent, or Firm*—Robert E. Bushnell, Esq.

(57) ABSTRACT

A telephone hook switch in a telephone includes: a capacitive sensor having a capacitance that varies when an object or a part of a human body having a charge contacts or approaches it; and a signal generation circuit for detecting the variation of the capacitance of the capacitive sensor when the object or the part of the human body contacts or approaches so as to generate an ON/OFF signal. As a result of the invention, mechanical and structural limitations on the telephone are overcome, and the economic use of an inner space of the telephone can be improved. In addition, various applications can be made to conform to an external shape of the telephone in terms of design.

20 Claims, 8 Drawing Sheets

TELEPHONE HOOK SWITCH USING NON-CONTACT CAPACITIVE SENSOR AND TELEPHONE USING THE SAME

CLAIM OF PRIORITY

This application makes reference to and claims all benefits accruing under 35 U.S.C. §119 from an application entitled HOOK SWITCH OF TELEPHONE TO USE NON CONTACT TYPE CAPACITIVE SENSOR AND TELEPHONE TO USE THE SAME, earlier filed in the Korean Intellectual Property Office on 12 Nov. 2004, and there duly assigned Serial No. 2004-92688.

BACKGROUND OF THE INVENTION

1. Technical Field

The present invention relates to a telephone hook switch and, more particularly, to a telephone hook switch using a non-contact capacitive sensor and a telephone using the same capable of overcoming a structural limitation as well as improving inner space usability of the telephone by employing a non-contact capacitive sensor as a hook switch for generating a call signal or a waiting signal for the telephone, instead of a mechanical construction.

2. Description of the Related Art

In general, modern society is called a third revolutionary era, i.e., an information revolution era. Human beings face the information revolution era via the agricultural revolution era and through the industrial revolution era. There are several information transmission means for representing the information revolution era. However, the most representative one is the telephone.

The telephone is operated by a series of operations, such as holding up or down a telephone receiver arranged on a main body of the telephone. The telephone includes a main body connected to a remote office line, a telephone receiver for transmission and reception, and a connection line connecting the main body and the telephone receiver.

In the main body, a mounting unit on which the telephone receiver is mounted is provided on one side of the upper surface, a keypad having a number of buttons for performing a function of the telephone is arranged on another side of the mounting unit, and a speaker for producing a receive signal of the telephone is mounted on a predetermined portion of the upper surface of the main body.

A hook switch for identifying whether a user is making a call (ON state) or not (OFF state) is provided on the mounting unit. When the user does not wish to make a call, the main body remains in a ready state, receives any call signal transmitted via the office line, and informs the user of the call signal through the speaker.

A plunger and the aforementioned hook switch are provided to implement ON/OFF functions in the telephone. The telephone hook switch has the shape of the telephone main body. Furthermore, under the mounting unit on which the telephone receiver is mounted, there are provided a plunger movably hinge-connected and elastically supported by a spring so as to protrude outside the mounting unit, the hook switch ON/OFF switched according to a pivoted state of the plunger, and a printed circuit board for switching a power supply path according to whether the contact of the hook switch is open or closed so as to change the ON/OFF state of the telephone.

When the telephone receiver is mounted on the mounting unit, pressure is applied by the telephone receiver to the plunger arranged and protruding from the mounting unit so that the plunger pivots inside the main body. The pivoting plunger changes the contact state of the hook switch so that the telephone remains OFF and awaits a call signal through the office line.

Furthermore, when the user lifts the telephone receiver off the mounting unit in order to make a call, the pressure applied to the plunger by the telephone receiver is removed, and the plunger returns to its initial state by means of a spring that elastically supports the plunger. As the plunger returns to its initial state, the contact of the hook switch switched by the plunger is switched again so that the telephone receiver remains in the ON state.

However, the telephone using the plunger and the hook switch as described above has a problem in that additional processes, such as assembling the plunger and the hook switch into the main body of the telephone and producing parts, are required. This increases the manufacturing cost of the telephone. In addition, there is another problem in that, when the elasticity of the spring that elastically supports the plunger is degraded due to frequent use and the hook switch does not operate well, ON/OFF operations of the telephone are not performed smoothly.

In addition, the weight of the telephone receiver should be more than a certain value in order to operate the plunger, and a space for accommodating the plunger and the hook switch operated by the plunger in the main body of the telephone, and a space for operating the plunger, are necessarily required. This limits the shape and the use of an inner space of the telephone main body. Therefore, there is a limitation imposed on design of the shape of the telephone.

The following patents are considered to be generally pertinent to the present invention, but are burdened by the disadvantages set forth above: U.S. Pat. No. 6,865,269 to Li et al., entitled METHOD AND APPARATUS FOR SWITCH HOOK DETECTION, issued on Mar. 8, 2005; U.S. Pat. No. 6,687,371 to Fischer et al., entitled MAINTAINING AN OFF-HOOK CONDITION DURING A CALL BRIDGE, issued on Feb. 3, 2004; U.S. Pat. No. 6,301,344 to Meyer et al., entitled INTELLIGENT PUBLIC TELEPHONE SYSTEM AND METHOD, issued on Oct. 9, 2001; U.S. Pat. No. 6,160,885 to Scott et al., entitled CALLER ID CIRCUIT POWERED THROUGH HOOK SWITCH DEVICES, issued on Dec. 12, 2000; U.S. Pat. No. 5,485,509 to Oliver, entitled TELEMETRY DEVICE INCLUDING A DYNAMIC OFF-HOOK DETECTOR, issued on Jan. 16, 1996; U.S. Pat. No. 4,613,730 to Fechalos et al., entitled ELECTRONIC TELEPHONE WITH FEATURE ACCESS AND SPEED DIALING INCLUDING LOOP BREAKS, issued on Sep. 23, 1986; and U.S. Pat. No. 4,528,425 to Melindo et al., entitled METHOD OF AND CIRCUITRY FOR DETECTING, AT A TELEPHONE EXCHANGE, THE LIFTING OF A SUBSCRIBER'S HANDSET IN RESPONSE TO RINGING CURRENT EMITTED BY THE EXCHANGE, issued on Jul. 9, 1985.

SUMMARY OF THE INVENTION

The present invention has been developed to solve the aforementioned problems. The present invention provides a telephone hook switch using a non-contact capacitive sensor that can measure electrostatic charges of conductive material, and a telephone performs ON/OFF operations in the telephone with the non-contact capacitive sensor.

In an exemplary embodiment of the present invention, a telephone hook switch using a non-contact capacitive sensor includes: a capacitive sensor having a capacitance that varies when an object or a part of a human body having charges contacts or approaches; and a signal generation circuit for detecting the capacitance of the capacitive sensor as it varies when the object or the part of the human body approaches so as to generate an ON/OFF signal.

The signal generation circuit preferably includes: an oscillator for oscillating with a frequency which varies according to a change in the capacitance of the capacitive sensor; and a comparator for comparing an output voltage of the oscillator with a reference voltage so as to determine whether or not an object having charges contacts or approaches, and for generating an ON/OFF signal based on the latter determination.

The telephone hook switch preferably further includes: a rectifier for rectifying an output signal of the oscillator so as to convert it into a DC voltage; and a differential amplifier for amplifying the DC voltage outputted by the rectifier and for transmitting the amplified DC voltage to the oscillator.

The capacitive sensor, preferably, contacts an inner surface of an insulating frame that has the shape of an apparatus on which the capacitive sensor is mounted.

In another exemplary embodiment of the present invention, a telephone using a telephone hook switch having a non-contact capacitive sensor includes: a telephone receiver having a capacitive member which charges; and a telephone main body having a mounting unit on which the telephone receiver is mounted, and a telephone hook switch using a non-contact capacitive sensor arranged under the mounting unit for detecting the charge of the capacitive member of at the telephone receiver so as to set hook on/off.

A detection surface depressed into, or protruding from, the mounting unit is preferably formed on the upper surface of the mounting unit so as to represent a location of the capacitive sensor hook switch arranged under the mounting unit.

In addition, the telephone, preferably, further includes an operation lamp arranged on one side of the mounting unit and connected to the capacitive sensor hook switch so as to indicate a detection state of the capacitive sensor hook switch and an operational state of the telephone.

The telephone receiver, preferably, includes: an upper housing having the shape of the telephone receiver, and having a predetermined space therein; a lower housing below and coupled to the upper housing, and having a transmitting unit and a receiving unit with a microphone and a speaker, respectively; and a capacitive member fixed to an inner side between the upper housing and the lower housing, and made of metal having a predetermined charge.

In addition, the telephone, preferably, further includes a conductive gasket for transmitting a charge of the capacitive member to the lower side of the capacitive member, the capacitive member adhering to the conductive gasket by means of a pressing unit arranged inside the upper housing.

The telephone receiver, preferably, includes: an upper housing having the shape of the telephone receiver, and having a predetermined space therein; a lower housing coupled under and to the upper housing, and having a transmitting unit and a receiving unit with a microphone and a speaker, respectively; and a capacitive member closely adhered to the bottom surface of the lower housing, and made of a conductive material, for transmitting the charge of a body of a user who uses the telephones receiver.

In addition, the telephone receiver, preferably, includes: an upper housing having the shape of the telephone receiver, and having a predetermined space therein; a lower housing coupled under and to the upper housing, and having a transmitting unit and a receiving unit with a microphone and a speaker, respectively; and a capacitive member closely adhered to the bottom surface of the lower housing, and made of metal having a predetermined charge.

In addition, the capacitive sensor hook switch, preferably, includes: a capacitive sensor having a capacitance that varies when an object or a part of a human body having a certain charge contacts or approaches; and a signal generation circuit for detecting a variation in the capacitance of the capacitive sensor as it varies when the object or the part of the human body approaches so as to generate an ON/OFF signal.

The signal generation circuit preferably includes: an oscillator for oscillating with a frequency which varies according to a change in the capacitance of the capacitive sensor; and a comparator for comparing an output voltage provided by the oscillator with a reference voltage so as to determine whether or not an object having a charge contacts or approaches, and for generating an ON/OFF signal based on the latter determination.

In addition, the telephone, preferably, further includes: a rectifier for rectifying an output signal of the oscillator so as to convert it into a DC voltage; and a differential amplifier for amplifying the DC voltage output from the rectifier so as to transmit the amplified DC voltage to the oscillator.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Hereinafter, a telephone hook switch using a non-contact capacitive sensor and a telephone using the same according to the present invention will be described in detail with reference to the attached drawings.

Throughout the detailed description of the present invention, the terms defined herein are defined in consideration of functions of the present invention, but can be changed according to the intention of the engineer and conventions. Thus, this disclosure should not be interpreted as limiting any technical element of the present invention.

Figure 1A:
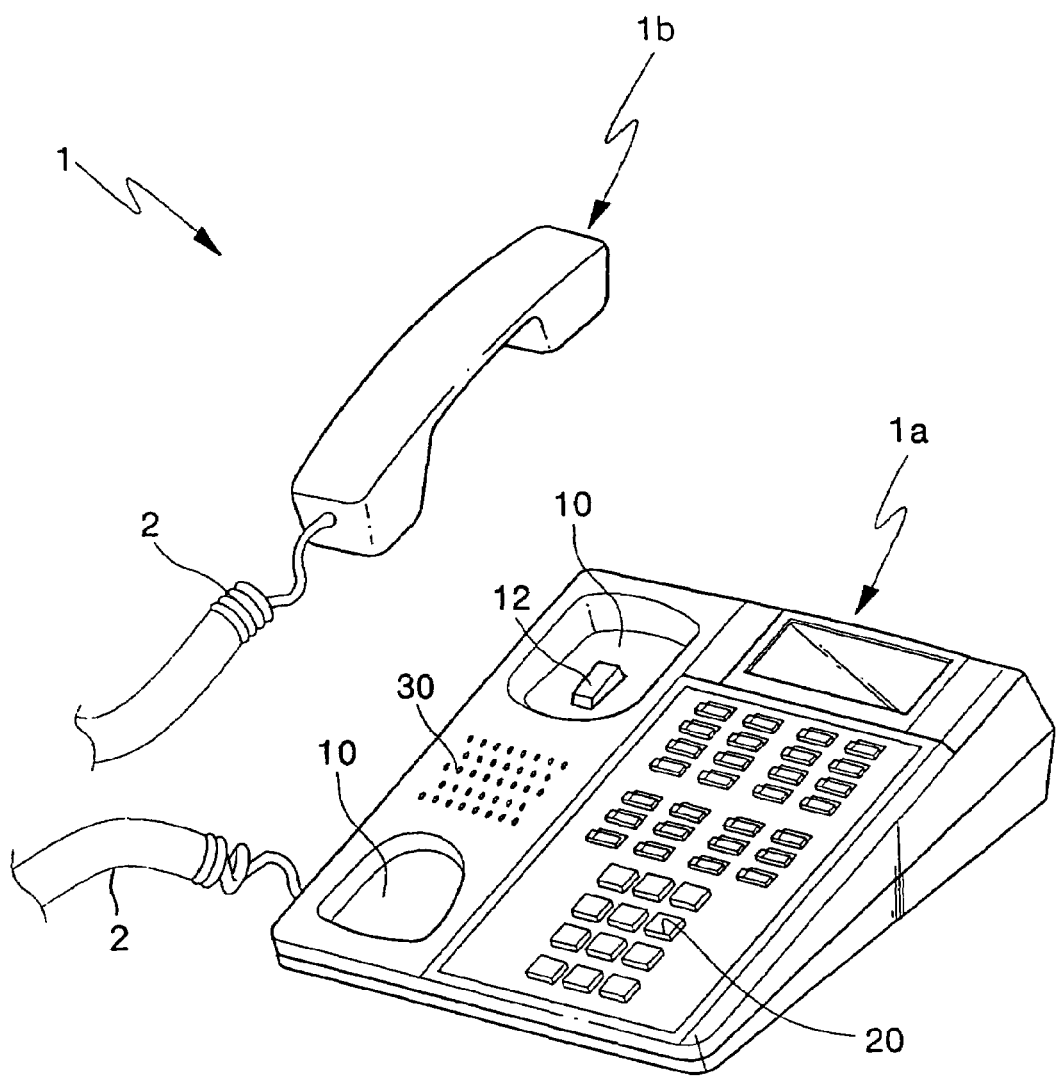
FIG. 1A is a perspective view showing a telephone using a hook switch.
Figure 1B:
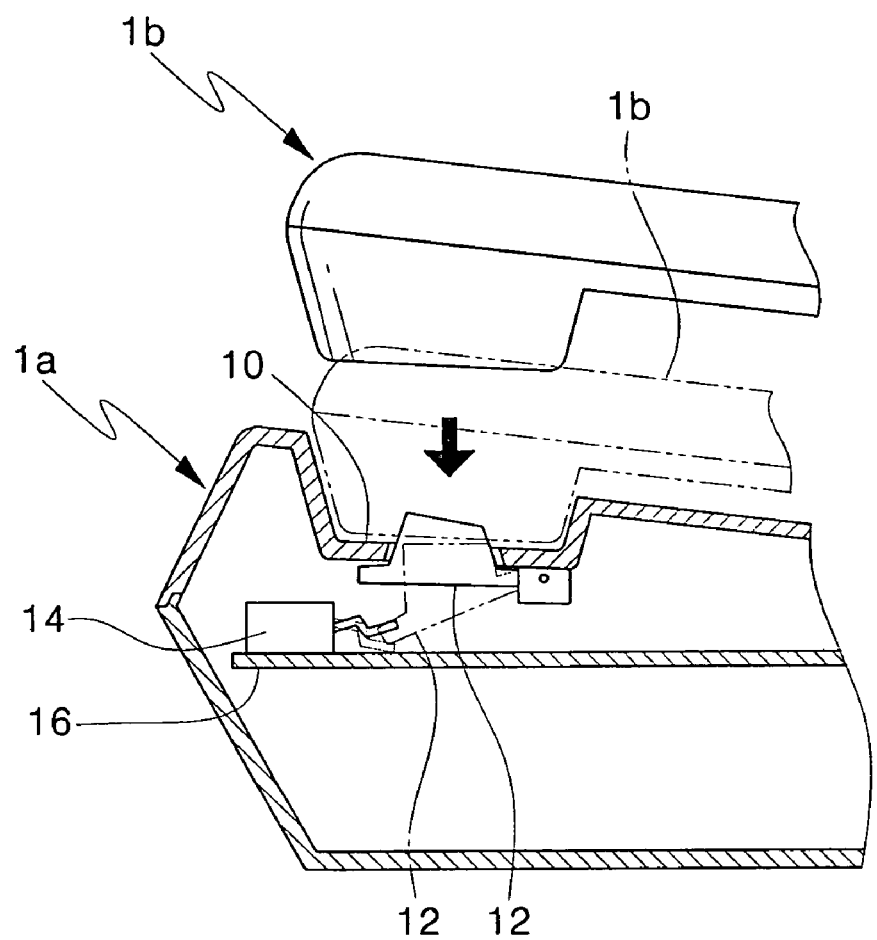
FIG. 1B is a cross-sectional view illustrating an operational state of the hook switch of FIG. 1A.

FIG. 1A is a perspective view showing a telephone using a hook switch, while FIG. 1B is a cross-sectional view illustrating an operational state of the hook switch.

As shown in FIGS. 1A and 1B, the telephone 1 includes a main body 1a connected to a remote office line (not shown), a telephone receiver 1b for transmission and reception, and a connection line 2 for connecting the main body 1a and the telephone receiver 1b.

In the main body 1a, a mounting unit 10 on which the telephone receiver is mounted is provided at one side of the upper surface of main body 1a, a keypad 20 having a number of buttons for performing a function of the telephone 1 is arranged on one side of the mounting unit 10, and a speaker 30 for producing a received signal of the telephone 1 is mounted in a predetermined portion of the upper surface of the main body 1a.

A hook switch 14 for identifying whether a user makes a call (ON state) or not (OFF state) is arranged in the mounting unit 10. When the user does not wish to make a call, the main body 1a remains in a ready state, and receives any call signal transmitted via the office line 2 so as to inform the user of the call signal through a speaker 30.

As described above, a plunger (not shown) and a hook switch 14 are provided to implement ON/OFF functions in the telephone 1.

Referring to FIG. 1B, which depicts a cross-sectional view of the telephone 1, the telephone hook switch 14 has the shape of the telephone main body 1a. Furthermore, under the mounting unit 10 on which the telephone receiver 1b is mounted, there are provided a plunger 12 movably hinge-connected and elastically supported by a spring (not shown) so as to protrude outside the mounting unit 10; the hook switch 14 ON/OFF switched according to a pivoted state of the plunger 12; and a printed circuit board 16 for switching a power supply path according to whether the contact of the hook switch 14 is open or closed so as to change the ON/OFF states of the telephone 1.

When the telephone receiver 1b is mounted on the mounting unit 10, pressure is applied by the telephone receiver 1b to the plunger 12 arranged and protruding from the mounting unit 10 so that the plunger 12 pivots inside the main body 1a. The pivoting plunger 12 changes the contact state of the hook switch 14 so that the telephone 1 remains OFF and awaits a call signal through the office line.

Further, when the user lifts the telephone receiver 16 off the mounting unit 10 in order to make a call, the pressure applied to the plunger 12 by the telephone receiver 1b is removed, and the plunger 12 returns to its initial state by means of a spring that elastically supports the plunger 12. As the plunger 12 returns to its initial state, the contact of the hook switch 14 switched by the plunger 12 is switched again so that the telephone receiver 1 remains in the ON state.

Figure 2:
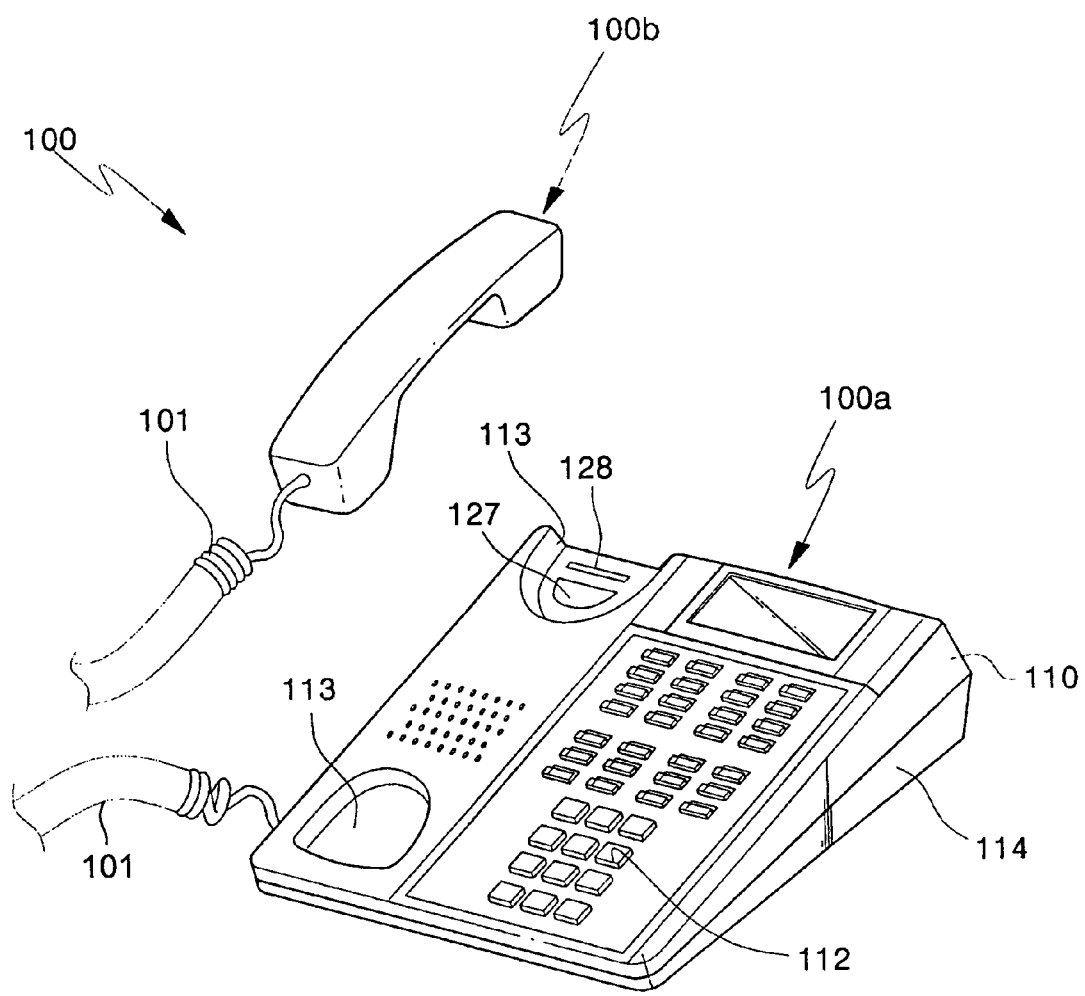
FIG. 2 is a perspective view showing a telephone using a telephone hook switch having a non-contact capacitive sensor according to the present invention.
Figure 3:
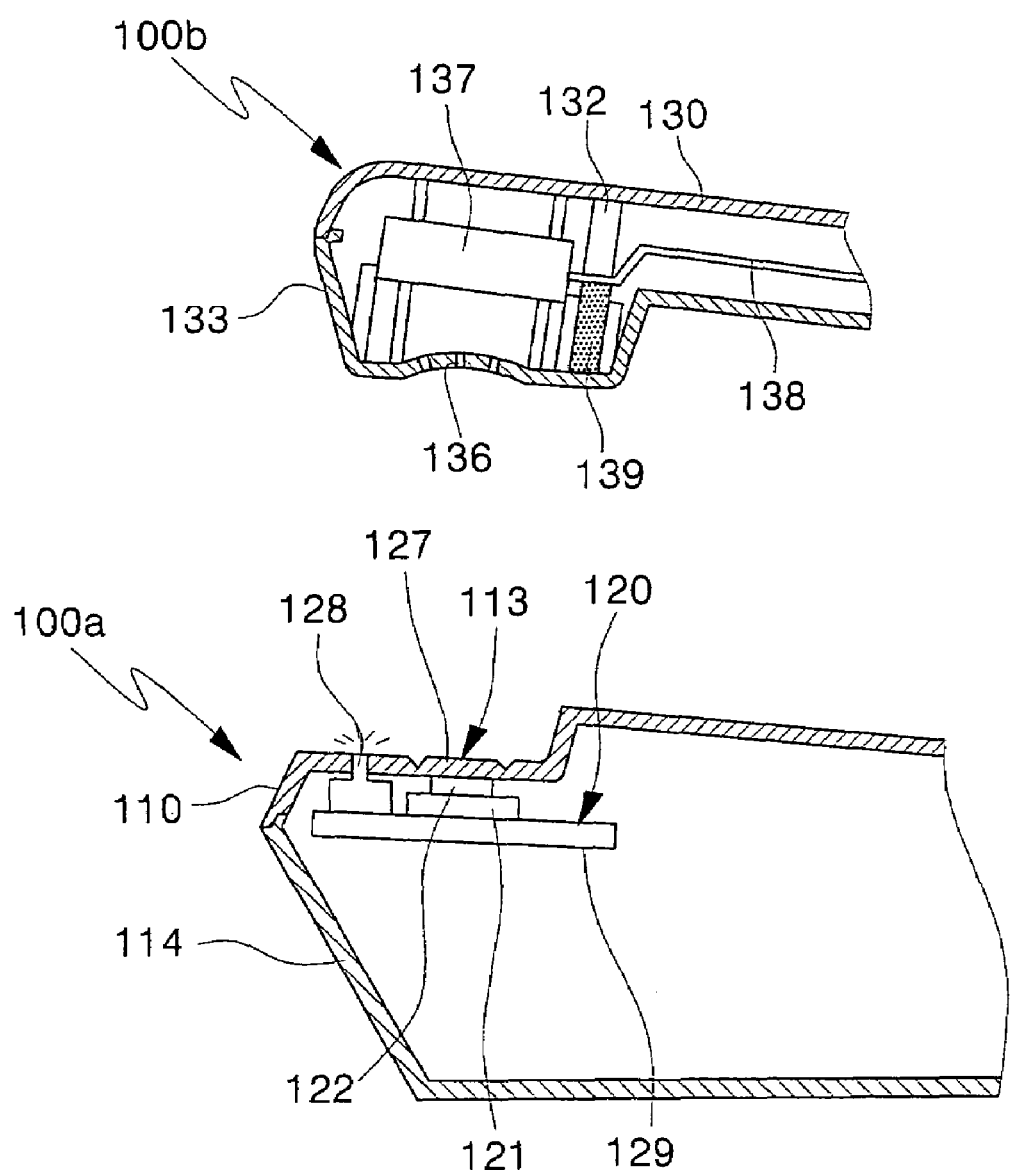
FIG. 3 is a cross-sectional view showing an inner arrangement of a telephone using a telephone hook switch having a non-contact capacitive sensor according to an embodiment of the present invention.
Figure 4:
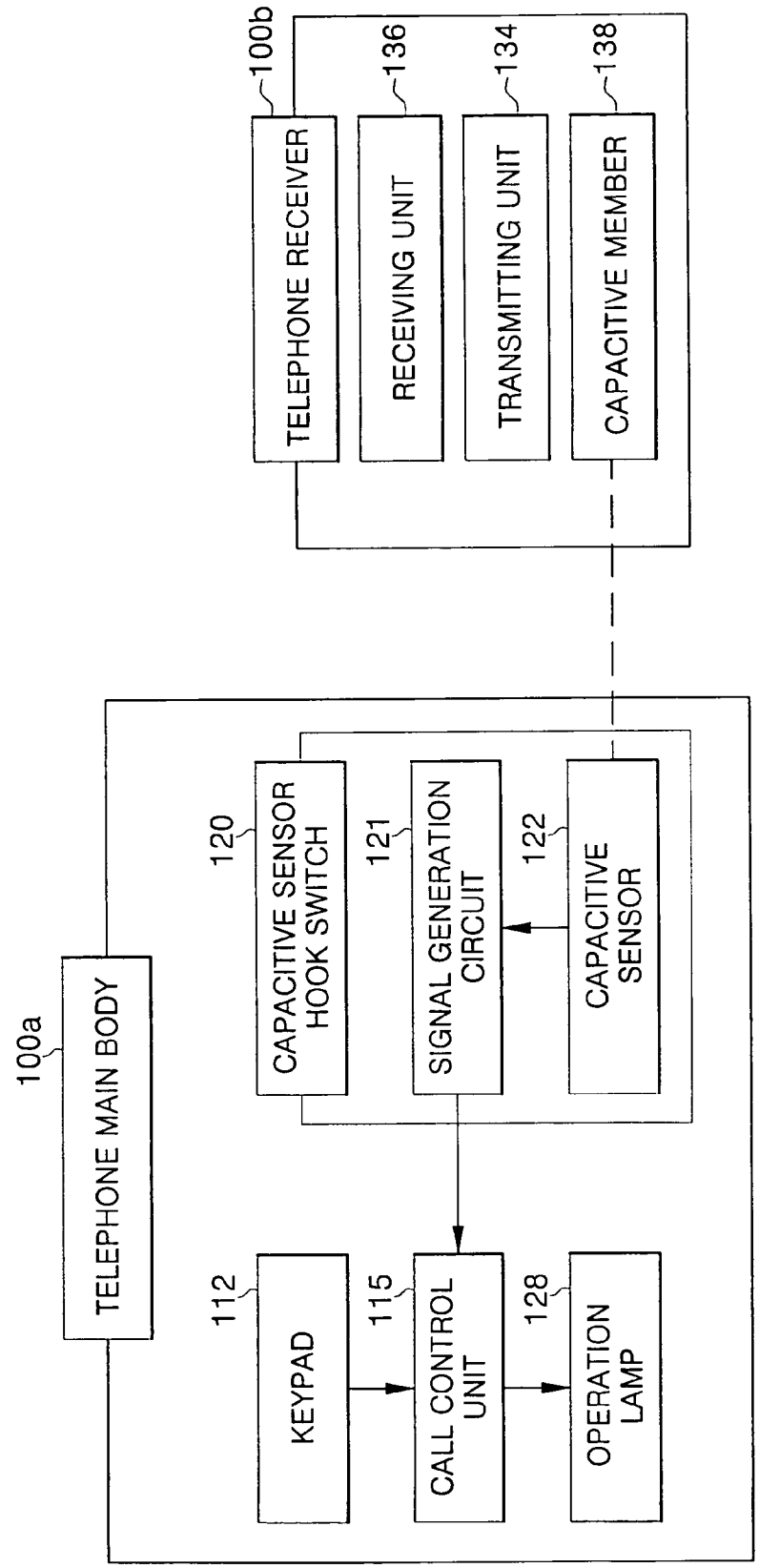
FIG. 4 is a schematic diagram showing an arrangement of a telephone using a telephone hook switch having a non-contact capacitive sensor according to the present invention.

FIG. 2 is a perspective view showing a telephone using a telephone hook switch having a non-contact capacitive sensor according to the present invention; FIG. 3 is a cross-sectional view showing an inner arrangement of a telephone using a telephone hook switch having a non-contact capacitive sensor according to an embodiment of the present invention; and FIG. 4 is a schematic diagram showing an arrangement of a telephone using a telephone hook switch having a non-contact capacitive sensor according to the present invention.

As shown, a telephone 100 according to the present invention includes: a telephone receiver 100b having a capacitive member 138 made of conductive metal and having a certain charge; and a telephone main body 100a electrically connected to the telephone receiver 100b through a connection line 101 and having a capacitive sensor hook switch 120 operated by a capacitive member 138 that is connected to a remote office line and arranged at the telephone receiver 100b.

The telephone main body 100a forms an upper surface thereof, and includes a cover 110 providing, at one side a key pad 112 having a number of function buttons for controlling the telephone 100 and a plurality of number buttons for use in making a phone call; a base 114 connected to a bottom surface of the cover 110 so as to form the bottom surface of the main body 100a; and a call control unit 115 in which a circuit for a phone call of the telephone 100 is provided inside the main body 100a.

A mounting unit 113, on which a transmitting unit 134 and a receiving unit 136 of the telephone receiver 100b are mounted, is provided on the other side of the cover 110. The capacitive sensor hook switch 120 for detecting a variation in charge when the telephone receiver 100b is mounted, or when a part of user body approaches, is arranged under the mounting unit 113, and a detection surface 127 having a predetermined portion of the mounting unit 113 protruding or depressed is provided on the upper surface of the mounting unit 113 to indicate the location of the capacitive sensor hook switch 120 arranged under the mounting unit 113. In addition, an operation lamp 128 connected to the capacitive sensor hook switch 120, and a call control unit 115 for indicating a detection state of the capacitive sensor hook switch 120 and an operation state of the telephone 100, are arranged on one side of the detection surface 127 indicating the location of the capacitive sensor hook switch 120.

The telephone receiver 100b has upper and lower housings 130 and 133, respectively, which have the shape of the telephone receiver 100b and a predetermined space therein. A microphone (not shown) for making a phone call, and a transmitting unit 134 and a receiving unit 136 having respective speakers, are provided at respective ends of the lower housing 133. Further, a capacitive member 138, which is detected by the capacitive sensor hook switch 120 in the telephone main body 100a, is mounted in the telephone receiver 100b.

The capacitive member 138 is made of a metal plate having a certain charge and located inside the telephone receiver 100b. A conductive gasket 139 for transmitting the charge of the capacitive member 138 toward the capacitive sensor hook switch 120 is located under the capacitive member 138. Further, the capacitive member 138 and the conductive gasket 139 always remain in contact by means of a pressing unit 132 provided inside the upper housing 130 of the telephone receiver 100b.

Figure 5:
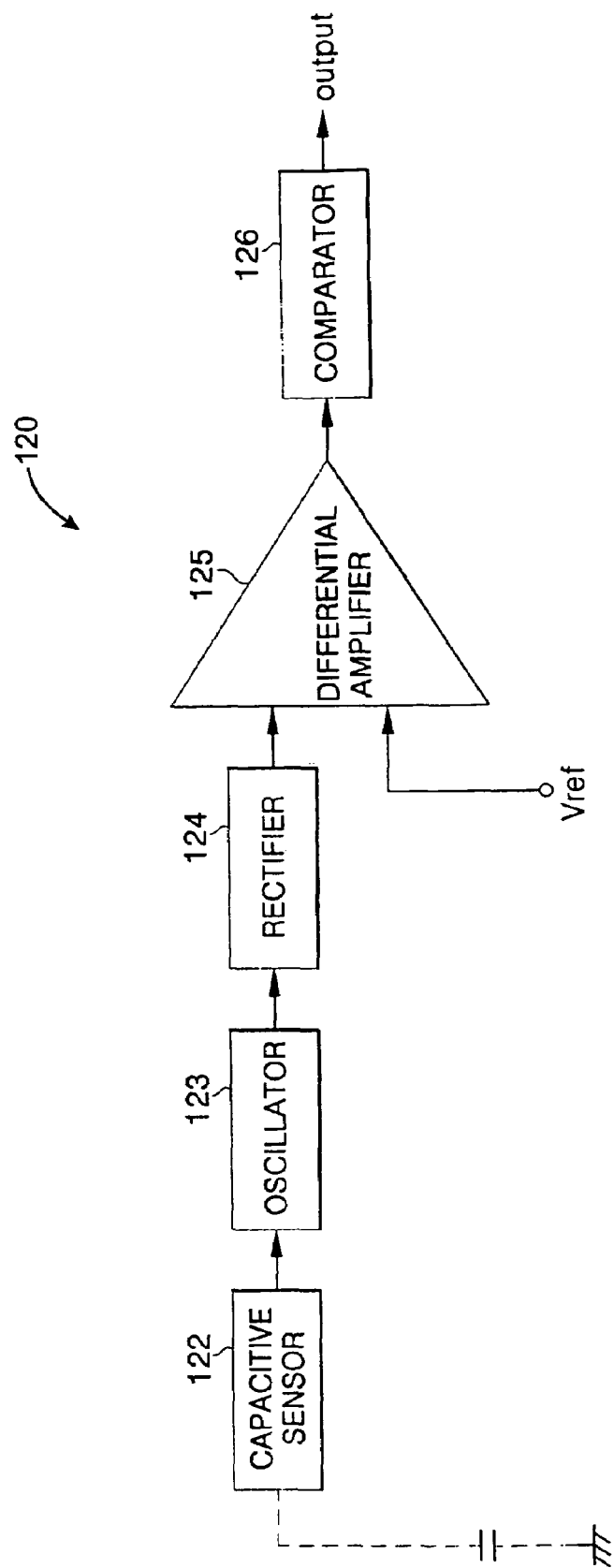
FIG. 5 is a circuit diagram showing an arrangement of a telephone hook switch using a non-contact capacitive sensor according to the present invention.

The arrangement of the capacitive sensor hook switch 120 will now be described in detail, with reference to FIG. 5, which is a circuit diagram showing an arrangement of a telephone hook switch using a non-contact capacitive sensor according to the present invention.

The capacitive sensor hook switch 120 detects charge of an object when the object (a part of the human body or conductive metal) having a certain charge (or capacitance) approaches. The capacitive sensor hook switch 120 includes: a capacitive sensor 122, the capacitance of which varies when the object (a part of the human body or conductive metal) having the certain charge approaches; an oscillator 123 for oscillating with a frequency which varies according to a change in the capacitance of the capacitive sensor 122; and a signal generation circuit having a rectifier 124 for rectifying an output signal of the oscillator 123 so as to convert it into a DC voltage, a differential amplifier 125 for amplifying the DC voltage outputted by the rectifier 124, and a comparator 126 for comparing the outputted DC voltage of the differential amplifier 125 to determine whether or not the object having the certain charge contacts or approaches, and for generating an ON/OFF signal. Furthermore, a printed circuit board 129 (see FIG. 3) is disposed at the bottom surface of the mounting unit 113 of the telephone 113 where the capacitive sensor 122 and the signal generation circuit 121 are mounted.

In the capacitive sensor hook switch 120, when the object having the certain charge approaches, the capacitance detected by the capacitive sensor 122 varies so that the oscillation frequency of the oscillator 123 in the signal generation circuit 121 also varies. The varying oscillation signal of the oscillator 123 is converted into a DC voltage, and then, the differential amplifier amplifies the DC voltage differentially with a predetermined voltage. Furthermore, the comparator 126 compares the output voltage of the differential amplifier 125 with a predetermined reference voltage so as to generate an ON signal when the object having the certain charge contacts or approaches.

The operation of a telephone hook switch using a non-contact capacitive sensor, and a telephone using the same, in accordance with the present invention will now be described in detail.

Figure 6:
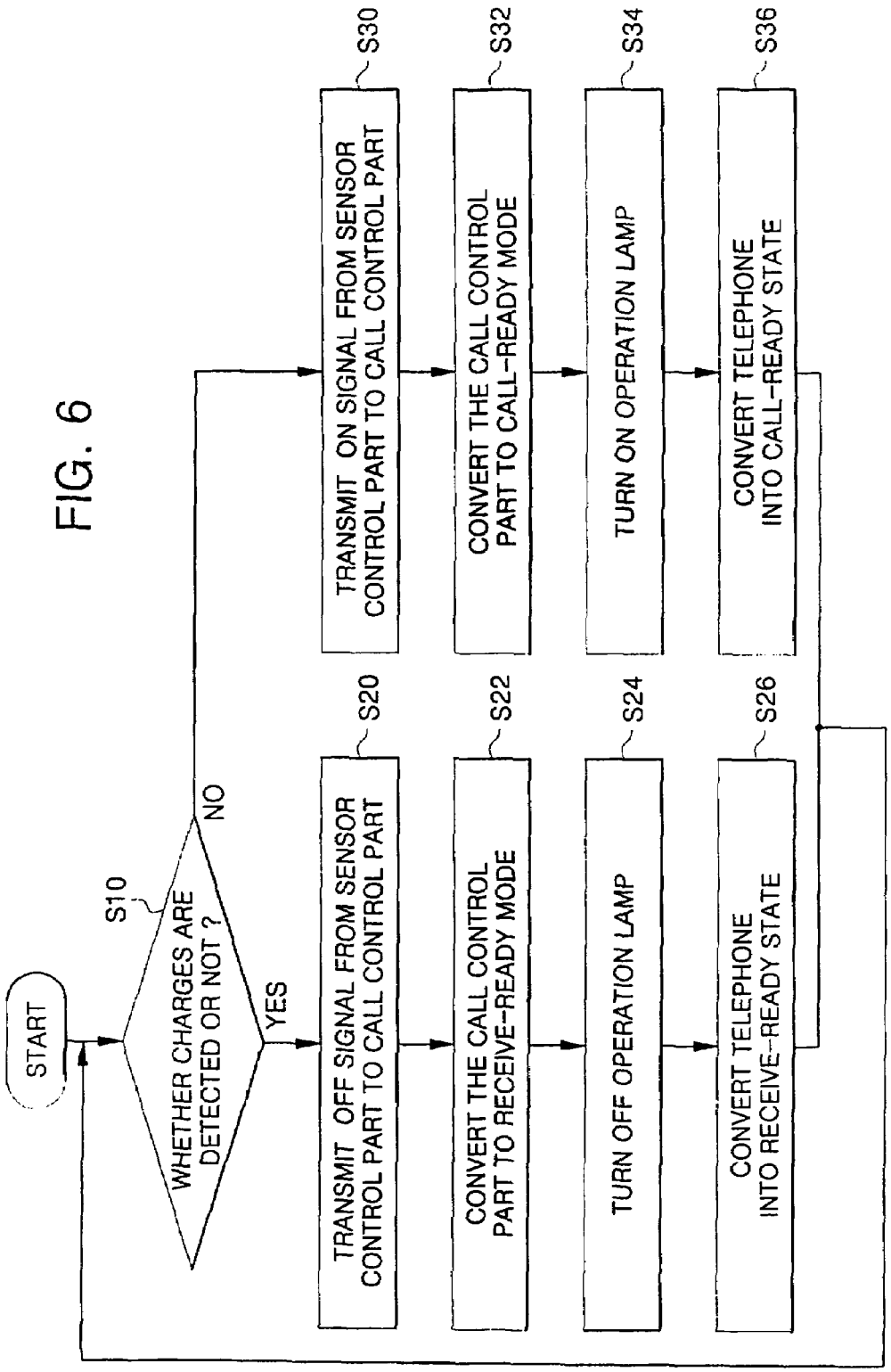
FIG. 6 is a flow chart illustrating the operation of a telephone using a telephone hook switch having a non-contact capacitive sensor according to the present invention.

FIG. 6 is a flow chart illustrating the operation of a telephone using a telephone hook switch having a non-contact capacitive sensor according to the present invention.

When the telephone receiver 110b is mounted on the mounting unit 113 of the telephone main body 110a, the capacitive sensor hook switch 120 disposed under the mounting unit 113 detects an amount of charge of the capacitive member 138 located inside the telephone receiver 100b and the conductive gasket 130 in contact with the capacitive member 138 so as to transmit the charge of the capacitive member 138 (S10).

When the capacitive sensor 122 of the capacitive sensor hook switch 120 detects the charge of the approaching capacitive member 138 in the telephone receiver 100b, the signal generation circuit 121 of the capacitive sensor hook switch 120 informs the call control unit 115 of the telephone 100 of the fact that the capacitive sensor 122 of the capacitive sensor hook switch 120 detects the charge so that the switch 120 is placed in an OFF state (S20).

Next, the call control unit 115 of the telephone 100 receives an OFF signal from the capacitive sensor hook switch 120, and the telephone is converted into a receive-ready mode or state (S22).

In addition, the capacitive sensor hook switch 120 cuts off power supplied to an operation lamp 128, located on one side of the mounting unit 113 for indicating an operational state of the capacitive sensor hook switch 120 and the call control unit 115, so as to indicate that telephone 100 is converted into the receive-ready state (S24).

Next, the telephone is converted into the receive-ready state, and waits for the receive signal of the remote office line (S26).

Furthermore, when or if the telephone receiver 100b is lifted off the mounting unit 113 of the telephone main body 100a, as the telephone receiver 100b is lifted off the mounting unit 113, charges generated by the capacitive member 138 disposed inside the telephone receiver 100b and the conductive gasket 139 which is in contact with the capacitive member 138, and transmitted charges of the capacitive member 138, are removed from the capacitive sensor hook switch 120 located under the mounting unit 113 (S10).

When the capacitive sensor 122 of the capacitive sensor hook switch 120 does not detect the charge of the capacitive member 138 of the telephone receiver 100b, the signal generation circuit 121 of the capacitive sensor hook switch 120 informs the call control unit 115 of the telephone 100 of the fact that the capacitive sensor 122 of the capacitive sensor hook switch 120 does not detect the charge, i.e., that switch 120 is in the ON state (S30).

Next, the call control unit 115 of the telephone receives the ON signal of the capacitive sensor hook switch 120, and the telephone 100 is converted to a call-ready mode or state (S32).

In addition, the capacitive sensor hook switch 120 supplies power to the operation lamp 128, which indicates an operational state of the capacitive sensor hook switch 120 and the call control unit 115 arranged at one side of the mounting unit 113, so as to indicate that the telephone 100 is converted into the call-ready state (S34).

Next, the telephone 100 is converted into the call-ready mode in which a call is available by manipulating a keypad 112 of the user, and the telephone 100 waits for the call (S36).

When a portion of the user's body, such as fingers, approaches the detection surface 127 provided at the mounting unit 113 of the telephone 100, the capacitive sensor 122 of the capacitive sensor hook switch 120 detects the charge of the approaching portion of the user's body. The signal generation circuit 121 of the capacitive sensor hook switch 120 transmits an OFF signal to the call control unit 115, and the call control unit 115 receives this so as to convert the telephone 100 into the receive-ready mode. Further, the capacitive sensor hook switch 120 blocks power supplied to the operation lamp 128 so as to indicate that the telephone 100 is converted into the receive-ready state.

In addition, when the user removes the part of the body from the detection surface 127, the charge of the part of the body detected by the capacitive sensor 122 of the capacitive sensor hook switch 120 is removed. Furthermore, the signal generation circuit 121 of the capacitive sensor hook switch 120 transmits an ON signal to the call control unit 115, and the call control unit 115 receives the ON signal so as to convert the telephone 100 to the receive-ready state. The capacitive sensor hook switch 120 then supplies power to the operation lamp 128 to indicate that the telephone 100 is the call-ready state.

Another embodiment of the present invention will now be described with reference to the attached drawings.

Figure 7:
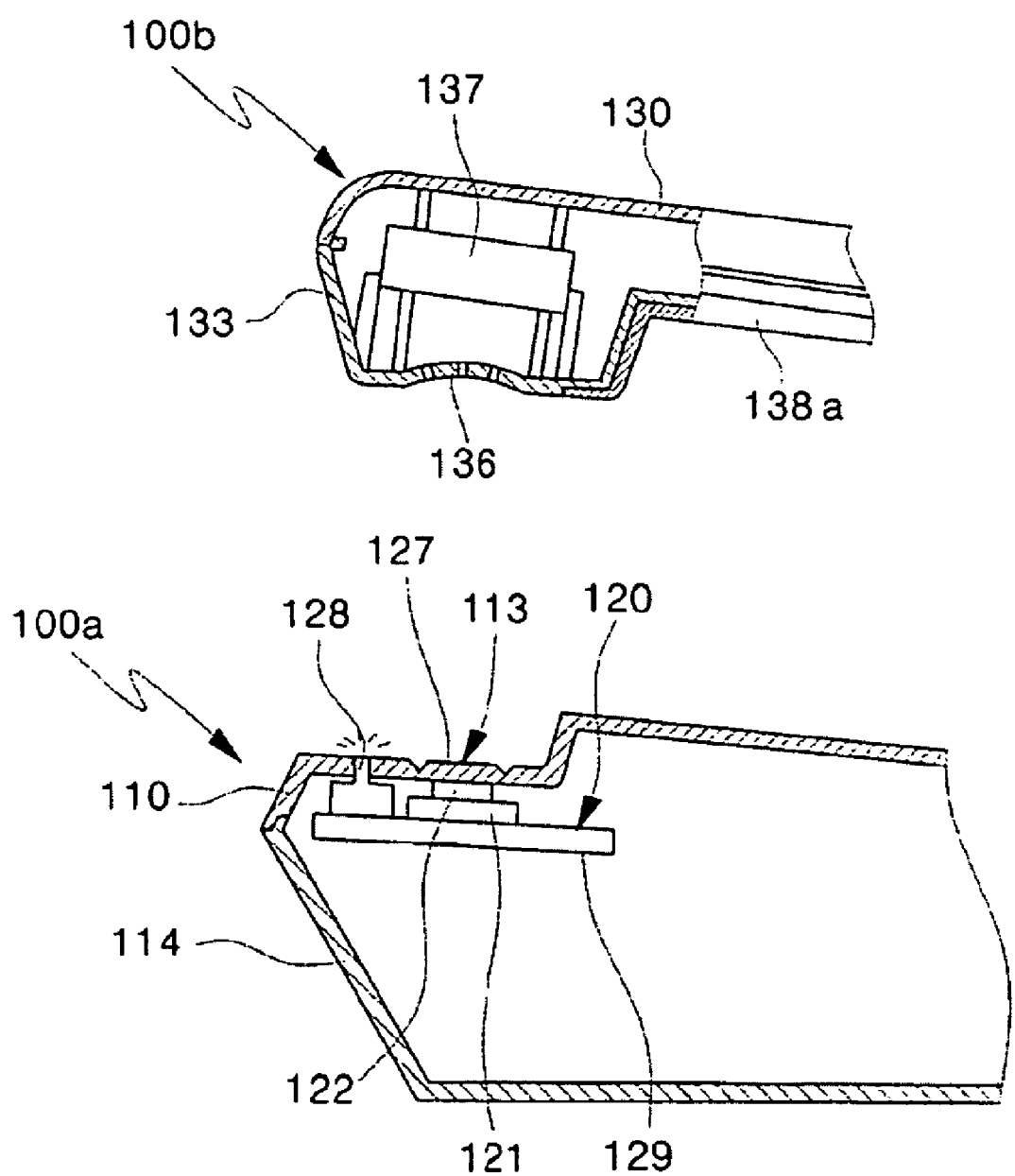
FIG. 7 is a cross-sectional view showing an inner arrangement of a telephone using a telephone hook switch having a non-contact capacitive sensor according to another embodiment of the present invention.

FIG. 7 is a cross-sectional view showing an inner arrangement of a telephone using a telephone hook switch having a non-contact capacitive sensor according to another embodiment of the present invention.

As shown in FIG. 7, this embodiment of the present invention is similar to the embodiment of the present invention described above, in that, by placing a capacitive member 138a outside the telephone receiver 100b, the capacitive sensor hook switch 120 detects the charge of the capacitive member 138a or the charge of the user's body transmitted through the capacitive member 138a.

In the telephone receiver 100b, upper and lower housings 130 and 133 having a given shape and a predetermined space therein are provided. A microphone (not shown) for making a phone call, and transmitting and receiving units 134 and 136, respectively, having respective speakers 137, are provided at respective sides of the lower housing 133. An outer capacitive member 138a, detected by the capacitive sensor hook switch 120 located in the telephone main body 100a, is provided in the bottom surface of the lower housing 133 of the telephone receiver 100b.

The outer capacitive member 138a may be a metal board having a certain charge at the bottom surface of the lower housing 133 of the telephone receiver 100b, or may be made of a conductive metal for transmitting a charge of the body of a user of the telephone receiver 100b, such that the charge is detected by the capacitive sensor hook switch 120 located under the mounting unit 113 provided at the telephone 110*a*.

As described above, in a telephone hook switch using a non-contact capacitive sensor, and a telephone using the same, according to the present invention, the telephone hook switch using a non-contact capacitive sensor capable of measuring charges of the conductive material is used to perform an ON/OFF operation of the telephone. Therefore, a structural limitation on the telephone, such as provision of a space for disposing a plunger and a hook switch operated by the plunger, and a space for operating the plunger, can be eliminated and the use of the inner space of the telephone can be enhanced.

In addition, with the telephone hook switch using a non-contact capacitive sensor arranged inside the telephone, various applications can be made in the shape of the telephone in terms of design, and it is not necessary for a telephone receiver to be larger or heavier than a predetermined size or weight to operate the plunger. Hence, overall problems with respect to the use of the plunger-type hook switch, such as the outer design of the telephone receiver and user convenience, can be solved.

Although preferred embodiments of the present invention have been described, those skilled in the art will appreciate that a variety of modification can be made without departing from the spirit and scope of the present invention, as defined by the attached claims. Therefore, modifications of the embodiments of the present invention will not be excluded from the scope of the present invention.

What is claimed is:

1. A telephone, comprising:
   a telephone receiver including a capacitive member having a charge; and
   a telephone main body including a mounting unit on which the telephone receiver is mounted, and a telephone hook switch having a capacitive sensor disposed under the mounting unit for detecting the charge of the capacitive member of the telephone receiver so as to set an ON/OFF state of the telephone.

2. The telephone according to claim 1, wherein a detection surface is formed on an upper surface of the mounting unit in conformity with a location of the capacitive sensor disposed under the mounting unit.

3. The telephone according to claim 1, further comprising an operation lamp disposed on the mounting unit and connected to the telephone hook switch for indicating a detection state of the telephone hook switch and an ON/OFF state of the telephone.

4. The telephone according to claim 1, wherein the telephone receiver comprises:
   an upper housing having a shape of the telephone receiver, and having a predetermined space therein;
   a lower housing coupled to the upper housing, and having a transmitting unit and a receiving unit with a microphone and a speaker, respectively; and
   a capacitive member fixed between the upper housing and the lower housing, and made of metal having a charge.

5. The telephone according to claim 4, further comprising a conductive gasket for transmitting the charge of the capacitive member to a lower side of the capacitive member;
   wherein the capacitive member is adhered to the conductive gasket by a pressing unit disposed inside the upper housing.

6. The telephone according to claim 1, wherein the telephone receiver comprises:
   an upper housing having a shape of the telephone receiver, and having a predetermined space therein;
   a lower housing coupled to the upper housing, and having a transmitting unit and a receiving unit with a microphone and a speaker, respectively; and
   a capacitive member closely adhered to a bottom surface of the lower housing, and made of a conductive material for transmitting a charge of a body of a user that uses the telephone receiver.

7. The telephone according to claim 1, wherein the telephone receiver comprises:
   an upper housing having a shape of the telephone receiver, and having a predetermined space therein; and
   a lower housing coupled to the upper housing, and having a transmitting unit and a receiving unit with a microphone and a speaker, respectively; and
   wherein the capacitive member is closely adhered to a bottom surface of the lower housing, and is made of metal having the charge.

8. The telephone according to claim 1, wherein the capacitive sensor has a capacitance that varies when an object having a certain charge approaches;
   said telephone hook switch further comprising a signal generation circuit for detecting a variation in the capacitance of the capacitive sensor when the object approaches so as to generate an ON/OFF signal.

9. The telephone according to claim 8, wherein the signal generation circuit comprises:
   an oscillator for oscillating with a frequency which varies according to a change in the capacitance of the capacitive sensor so as to produce an output voltage; and
   a comparator for comparing the output voltage produced by the oscillator with a reference voltage to determine whether the object having the charge approaches, and for generating the ON/OFF signal based on the determination.

10. The telephone according to claim 9, further comprising:
    a rectifier for rectifying the output voltage produced by the oscillator so as to convert the output voltage produced by the oscillator into a DC voltage; and
    a differential amplifier for amplifying the DC voltage, and for transmitting the amplified DC voltage to the comparator.

11. The telephone according to claim 8, wherein the capacitance of the capacitive sensor varies when the object having the charge approaches and contacts the capacitive sensor.

12. The telephone according to claim 11, further comprising control means responsive to an object approaching and contacting the capacitive sensor for placing the telephone in a call-ready mode.

13. The telephone according to claim 11, further comprising control means responsive to an object not approaching and not contacting the capacitive sensor for placing the telephone in a receive-ready mode.

14. The telephone according to claim 1, further comprising control means responsive to detection of the charge of the capacitive member by the capacitive sensor for placing the telephone in an OFF state.

15. The telephone according to claim 1, further comprising control means responsive to non-detection of the charge of the capacitive member by the capacitive sensor for placing the telephone in an ON state.

16. A telephone, comprising:
    a telephone receiver including a capacitive member having a charge and a conductive gasket; and
    a telephone main body including a mounting unit on which the telephone receiver is mounted, and a capacitive sensor hook switch disposed under the mounting unit, said conductive gasket transmitting the charge of the capacitive member toward the capacitive sensor hook switch, said capacitive sensor hook switch detecting the transmitted charge so as to set an ON/OFF state of the telephone.

17. The telephone according to claim 16, further comprising, in said telephone receiver, a pressing unit pressing on said capacitive member to ensure said capacitive member and said conductive gasket always remain in contact.

18. The telephone according to claim 16, wherein said capacitive member is disposed inside the telephone receiver.

19. The telephone according to claim 16, wherein said capacitive member is disposed outside the telephone receiver.

20. The telephone according to claim 19, wherein said capacitive member is made of a conductive metal for transmitting a charge of a body of a user.

* * * * *

UNITED STATES PATENT AND TRADEMARK OFFICE
CERTIFICATE OF CORRECTION

PATENT NO. : 7,580,509 B2  Page 1 of 1
APPLICATION NO. : 11/269580
DATED : August 25, 2009
INVENTOR(S) : Ho-Kyong Seo It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 959 days.

Signed and Sealed this

Fourteenth Day of September, 2010

David J. Kappos
*Director of the United States Patent and Trademark Office*